United States Patent [19]

Marin et al.

[11] Patent Number: 4,654,815
[45] Date of Patent: Mar. 31, 1987

[54] ANALOG SIGNAL CONDITIONING AND DIGITIZING INTEGRATED CIRCUIT

[75] Inventors: James S. Marin, Garland, Tex.; Khen-Sang Tan, Plantation, Fla.

[73] Assignee: Texas Instruments Incorporated, Dallas, Tex.

[21] Appl. No.: 699,516

[22] Filed: Feb. 7, 1985

[51] Int. Cl.⁴ ............................................. G06J 1/00
[52] U.S. Cl. ................. 364/606; 340/347 M; 340/347 CC; 340/347 SH; 364/602; 364/604
[58] Field of Search ............... 364/600, 602, 604, 606, 364/607, 608; 340/347 M, 347 AD, 347 DA, 347 CC, 347 SH

[56] References Cited

U.S. PATENT DOCUMENTS

| | | | |
|---|---|---|---|
| 3,972,627 | 8/1976 | Rabl et al. | 250/576 X |
| 4,150,366 | 4/1979 | Price | 340/347 M X |
| 4,439,756 | 3/1984 | Shenoi et al. | 340/347 M |
| 4,456,963 | 6/1984 | Wiggins | 364/571 X |
| 4,472,707 | 9/1984 | Wilensky et al. | 340/736 |
| 4,535,411 | 8/1985 | Blackburn et al. | 364/550 X |
| 4,573,026 | 2/1986 | Curtis et al. | 455/42 X |

Primary Examiner—Joseph Ruggiero
Attorney, Agent, or Firm—Alva H. Bandy; Leo N. Heiting; Melvin Sharp

[57] ABSTRACT

An analog signal conditioning and digitizing integrated circuit is provided having a multiplying digital to analog converter means (MDAC) including a gain capacitor array and an offset capacitor array, an operational amplifier, a feedback circuit including a feedback capacitor and a feedback clamping transistor, the operational amplifier and feedback circuit connected to the gain and offset capacitor arrays for setting the gain and the amount of offset correction of the MDAC, a correlated double sample circuit including a series capacitor connected to the operational amplifier and a series clamping transistor connected to the junction of the series capacitor and a buffer amplifier for sampling the noise to be substracted and/or nulled across the series capacitor, and an analog to digital converter operatively connected to the MDAC for digitizing the output of the MDAC. In other embodiments the integrated circuit has separate bond pads for the analog signal inputs and outputs of the MDACs and DACs or for implementing feedback/feedforward discrete time transfer functions.

14 Claims, 7 Drawing Figures

ANALOG SIGNAL CONDITIONING AND DIGITIZING INTEGRATED CIRCUIT

This invention relates to integrated circuits and more particularly to analog signal conditioning and digitizing integrated circuits for electro optic systems.

In the past, electro-optic systems such as Forward Looking Infrared systems have operated in the analog signal processing domain and more recently in the digital signal processing domain. The advantages of the digital approach are: better imagery, higher performance, more capabilities to enhance performance of the analog system. Also, digital signal processing allows more signal processing, frame storage and data transmission. Data transmission cannot be done from long-term storage using the analog technique.

The digital approach has been to use multiple chip circuits in separate packages. The packages have included the multiplying digital to analog converter (MDAC) for conditioning the analog outputs, the analog to digital converter (ADC) for digitizing the conditioned analog signal, logic circuitry for the ADC analog to digital converter and sequencing circuitry for the tri-state bus. A disadvantage of digital multiple chip processing systems is their size, which limits their use in many system applications.

Features of the present invention are: an offset correction circuit for minimizing offset errors, the inclusion of an output register which allows another conversion to start prior to transferring the previous result to external logic, and the ability to short cycle or prematurely terminate a conversion while saving the results collected up to the time of termination; terminating at six bits, for example, instead of the normal 10 bits. The short cycle feature can be used to increase the conversion rate at the expense of reduced resolution.

For additional information concerning the prior art techniques those persons skilled in the art are referred to "All-MOS Analog/Digital Conversion Techniques,—An Overview," Paul R. Gray and D. A. Hodges, IEEE Circuits and Systems Magazine, Vol. 1, No. 2, June 1979, pp. 822-831.

Accordingly, it is an object of this invention to provide an analog signal processor which is economical to manufacture, compact in size and highly reliable.

Another object of the invention is to provide an analog signal conditioning and digitizing integrated circuit for instrumentation, communication, and control subsystem and systems functions including those for electro-optic devices.

A further object of the invention is to provide an analog to digital converter having improved processing accuracy and speed without post processing, e.g. laser trimming.

Yet another object of the invention is to provide an analog to digital converter having a short cycle conversion to allow faster conversion rate with less than 10 bit resolution.

Briefly stated, the invention comprises an integrated circuit that operates on an analog continuous time signal. The IC processes the signal through a linear equation as follows:

$$Vout = A\ Vin + B$$

where Vout is a digital output, A is a digitally programmable gain, Vin is an analog input signal and B is a digitally programmed offset.

Other objects and features of the invention will become more readily apparent from the following detailed description when read in conjunction with the accompanying drawings, in which.

Figure 1:
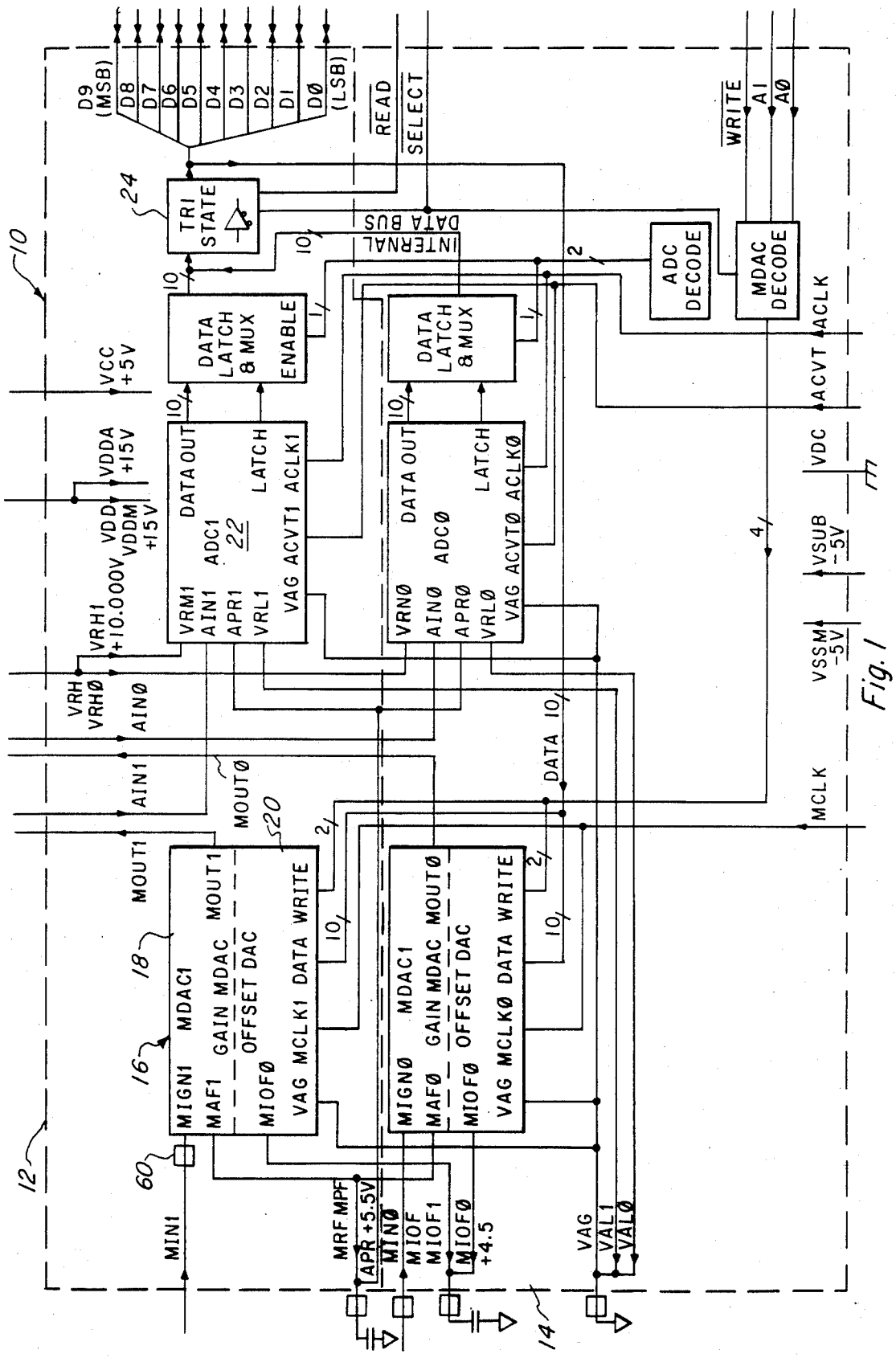
FIG. 1 is a functional block diagram of the multiplying digital to analog converter (MDAC)-analog to digital converter (ACD) integrated circuit (IC) constituting a first embodiment of the invention.

Referring now to FIG. 1, an integrated circuit (IC) 10 includes two signal processing channels 12 and 14 which can process two signals of a full parallel data acquisition structure. Multiple ICs can be connected for processing several channels. For example, a forward looking infrared detector device may have a linear array of 180 detectors; in which case 90 of the ICs are connected for signal processing.

As the two channels 12 and 14 are identical, only Channel 12 will be described. Each channel comprises a multiplying digital to analog converter (MDAC)16, which contains two digital to analog converters (DACs) 18 and 20. DAC 18 performs a gain adjustment and DAC 20 performs an offset correction. Each channel 12 and 14 also has an analog to digital converter (ADC) 22 connected to its MDAC 16. ADC 22 has a built in sample and hold (S and H) circuit and buffer register. The two channels 12 and 14 share a tri-state bus driver 24.

Figure 2:
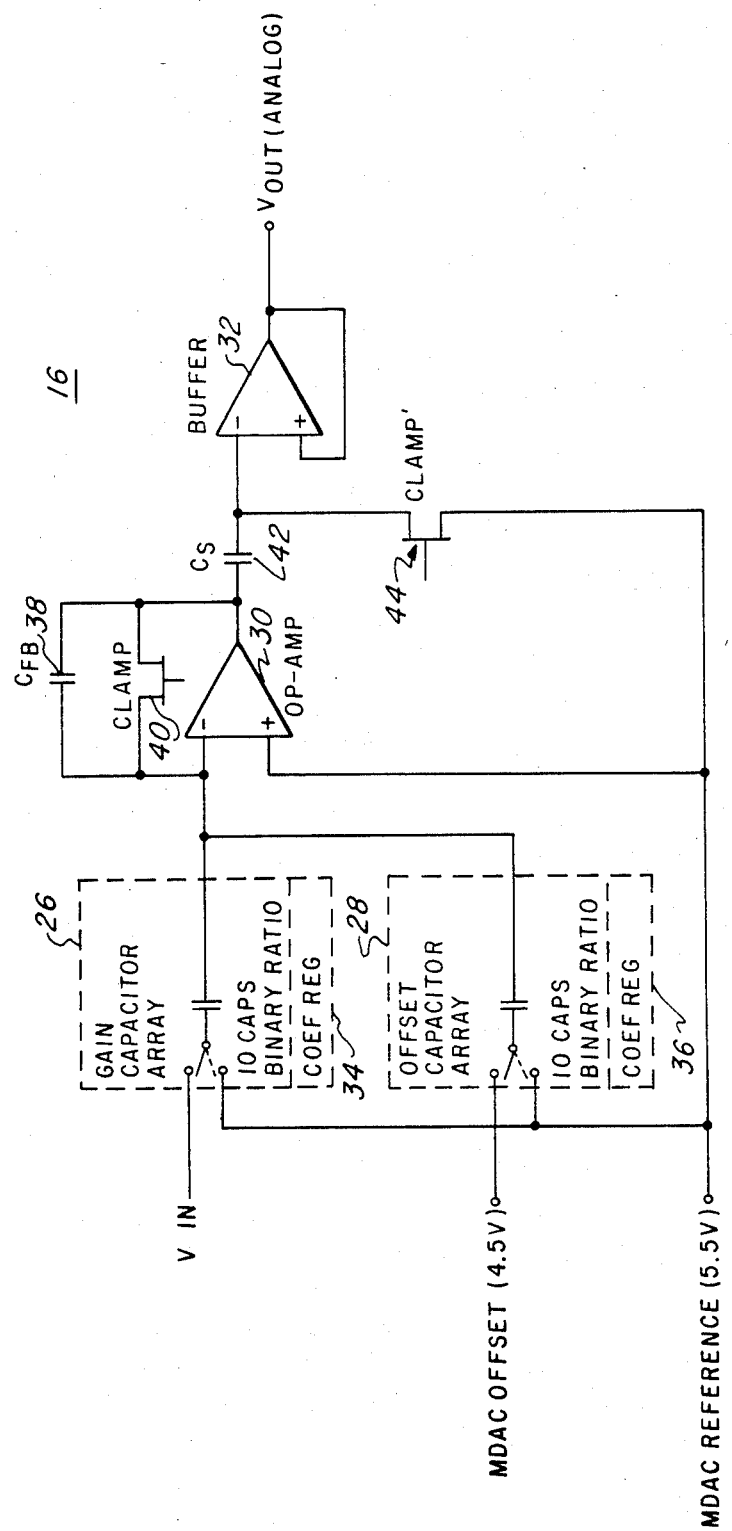
FIG. 2 is a functional block diagram of the MDAC.

Referring now to FIG. 2, the MDAC 16 includes a gain capacitor array 16, offset capacitor array 28, operational amplifier (Op Amp) 30, buffer 32, control logic 34 and 36, feedback capacitor (Cfb) 38, a feedback clamp transistor 40, a series capacitor (Cs) 42, and a series clamp transistor 42.

The two capacitor arrays 26 and 28, feedback capacitor 38, feedback clamp transistor 40 and the op-amp 30 form a summing and inverting negative feedback amplifier. Each capacitor array contains a plurality of capacitors which have capacitance values that are related by a binary ratio, i.e., 1,2,4, 8, 16, 32, 64, 128 ... One plate of each capacitor of the arrays of capacitors 26 and 28 is common to all capacitors in the arrays; the other plate of each capacitor is switched between a signal input and a reference voltage. The switches of the arrays of capacitors 26 and 28 are controlled by the control logic and the data of the coefficient registers 34 and 36.

The gain of the MDAC(Vout/Vin) is set by the sum of the capacitance values connected to Vin divided by the value of the feedback capacitor 38. The amount of offset adjustment is set by the sum of the capacitance values connected to MDAC Offset divided by the value of the feedback capacitor 38. Additional background information for the capacitor arrays for those persons skilled in the art is provided in "An MOS Digitally Controlled Analog Attenuator for Voiceband Signals," IEEE Journal of Solid State Circuits, Vol. SC-14, No. 1, February 1979, pp. 74–79.

The feedback clamp transistor 40 is used to periodically reset the MDAC 16 and correct drifts that occur from charge leakage off the capacitor arrays 26 and 28 and feedback capacitor 38. The clamping operation causes excessive sampled noise to appear at the output of the op-amp 30. The series capacitor 42 and the series clamp transistor 44 forms a correlated double sample (CDS) circuit which allows the sampled noise to be subtracted or nulled across the series capacitor. The release of the series capacitor 42 is delayed until after clamp transistor 40 action by a preselected amount of time to allow operational amplifier 30 to stabilize.

Figure 3:
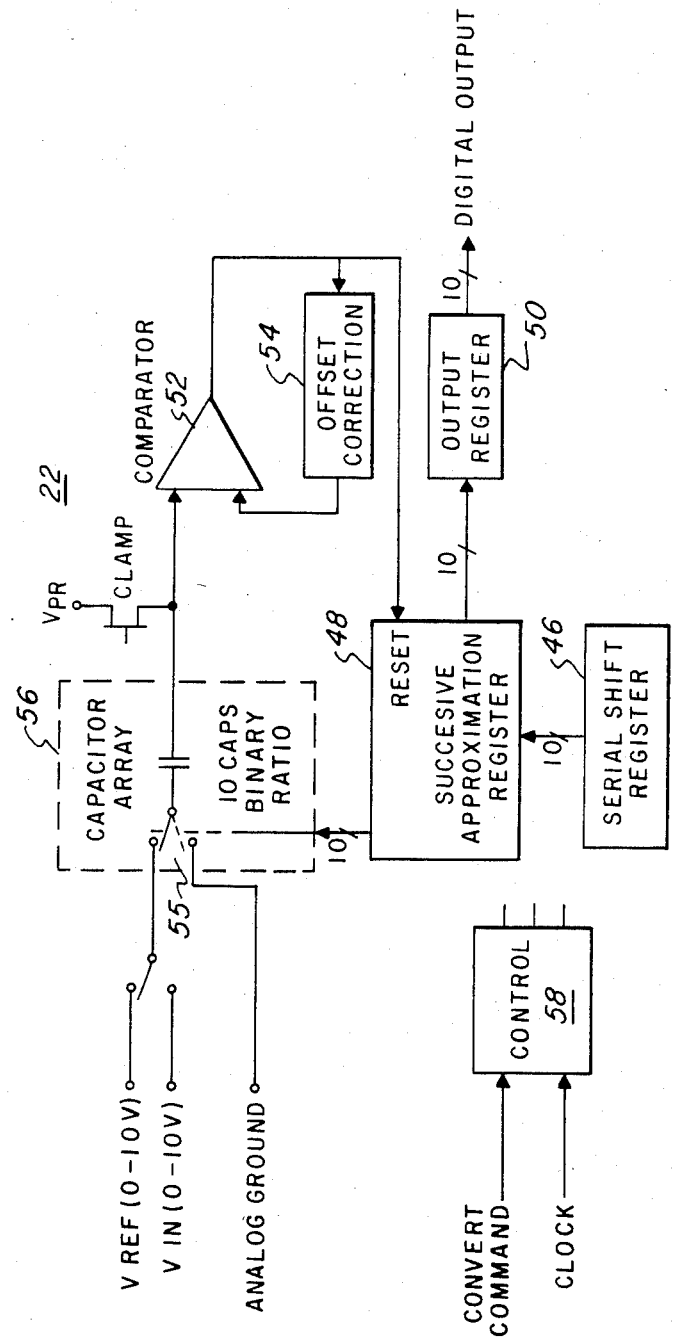
FIG. 3 is a functional block diagram of the ADC.

Referring now to FIG. 3, the ADC 22 includes a serial shift register 46, successive approximation register (SAR) 48, output register 50, comparator 52, offset correction circuit 54, capacitor array 56 and control logic 58.

Figure 4:
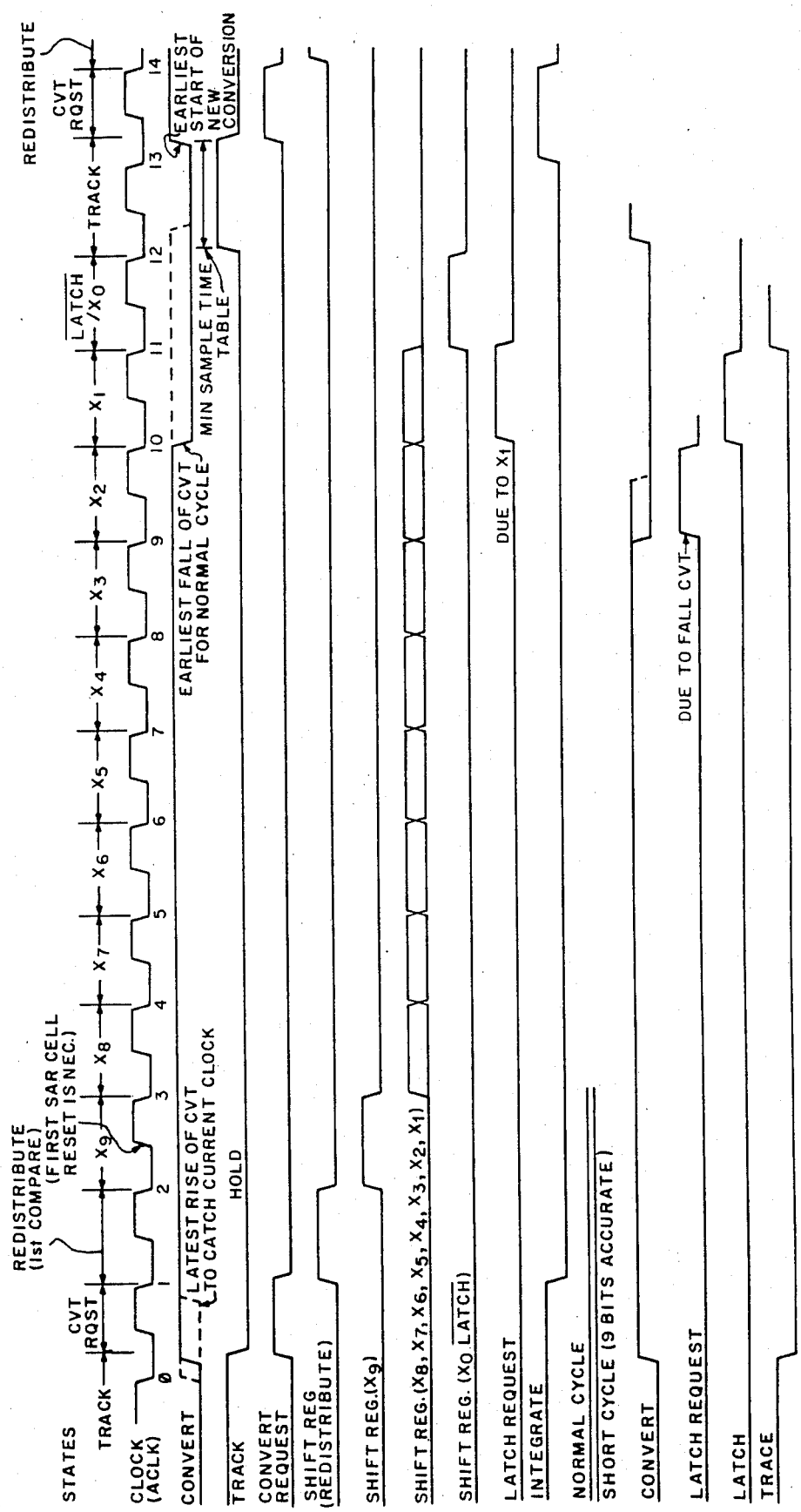
FIG. 4 is a timing diagram for the ADC.

The sample and hold function of the data acquisition channel is obtained in the ADC by storing charge in the capacitor array 56 during a sample period and holding the charge in the capacitor array during a conversion. A conversion is accomplished by successively switching the isolated plate of each capacitor of the capacitor array 56 between analog ground (0.0 V) and a reference voltage (Vref). Following each switch, the voltage on the common plate of the capacitor array is compared to the output of the offset correction circuit 54. (The output of the offset correction circuit is constant during the conversion.) The result of the comparison is used to either reset or leave set the switches connected to the most recently switched (tested) capacitor. The ADC is sequenced by shifting a bit through the shift register 46. The compare operation is done by the comparator 52, and the test or reset operation or both is done by the SAR 48. The final state of the SAR is transferred to the output register 50 at the end of the conversion. A timing diagram for the ADC is shown in FIG. 4.

The offset correction circuit 54 minimizes offset errors and during the sample period nulls comparator offsets. The use of the output register 50 allows another conversion to be started prior to transferring the previous result to external logic. Further, the ADC can be short cycled or a conversion prematurely terminated while saving the results collected up to the time of termination. This feature can be used to increase the conversion rate at the expense of reduced resolution. Those persons skilled in the art requiring additional information are referred to James L. McCreary and Paul R. Gray. "All-MOS Charge Redistribution Analog-to-Digital Conversion Techniques—Part I" and Part II, IEEE J. Solid-State Circuits, SC-10, December 1975, pp. 371-385.

The integrated circuit 10 (FIG. 1) has separate bond pads for the analog signal inputs and outputs of the MDACs and ADCs; this feature allows the IC to be used for simple data conversion applications, i.e., isolated ADCs and DACs or for implementing feedback-/feedforward discrete time transfer functions.

Figure 5:
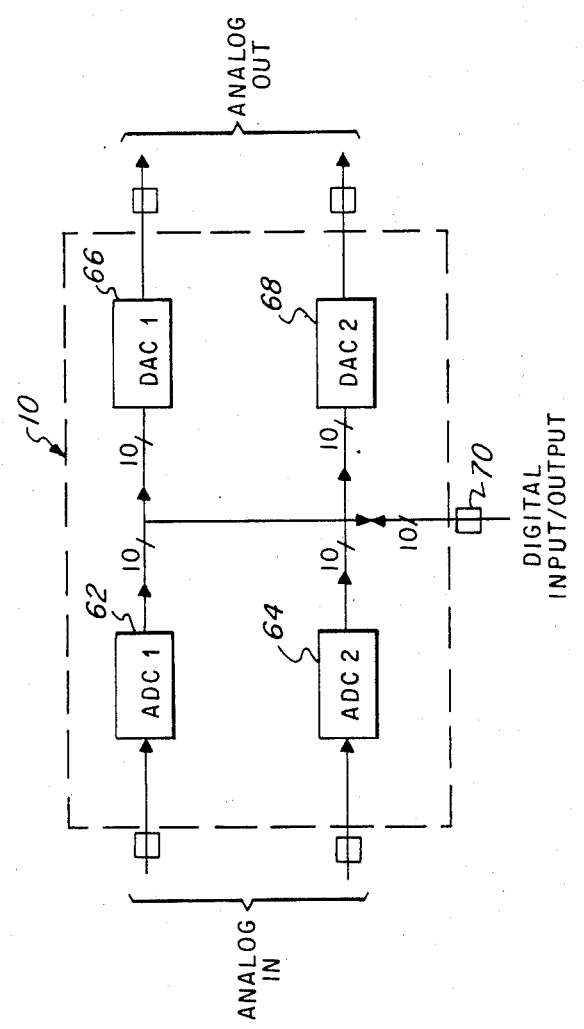
FIG. 5 is a block diagram of a second embodiment of the invention.

In the second embodiment (FIG. 5), the IC 10 functions as 2 ADC's 62 and 64 and 2 DACs 66 and 68 tied to a common digital bus 70. Data to and from each function is passed through the digital bus 60 under control of an external controller (not shown).

Figure 6:
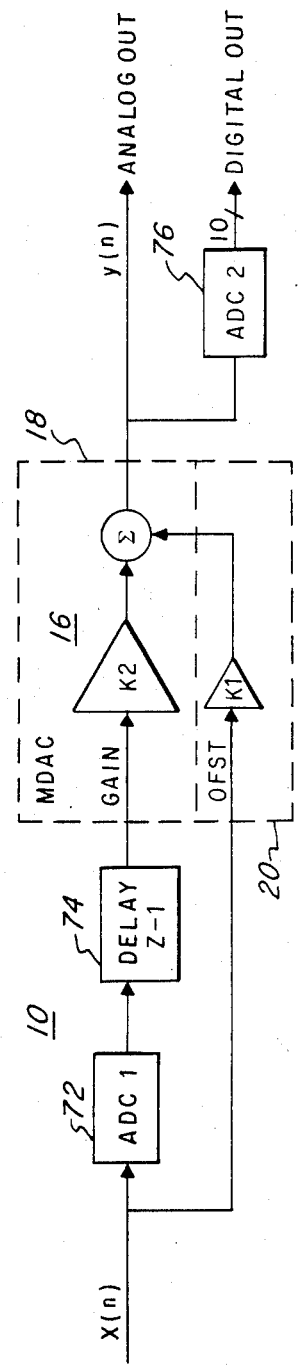
FIG. 6 is a block diagram of a third embodiment of the invention.
Figure 7:
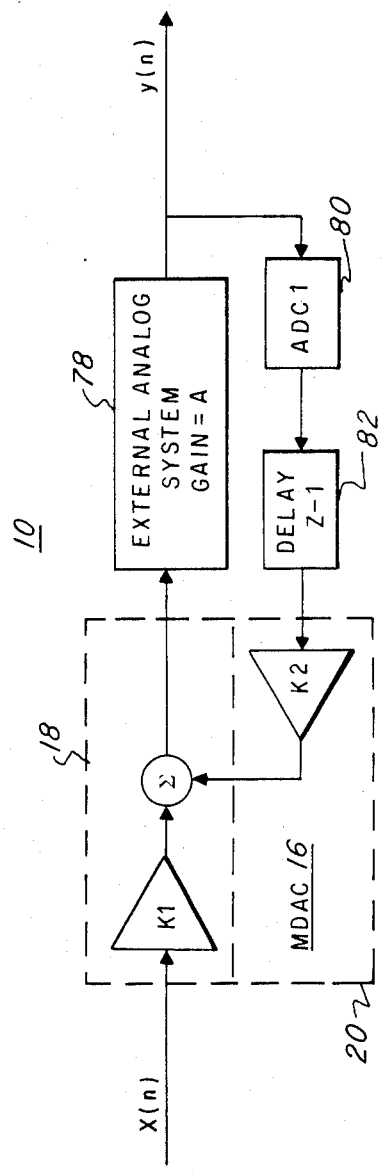
FIG. 7 is a block diagram of a fourth embodiment of the invention.

In a third embodiment (FIG. 6), the IC 10 is configured to implement a feedforward discrete time transfer function. The transfer function is as follows:

$$y(n) = k1 \times (n) + k2 \times (n-1)$$

and the z-domain transfer function is:

$$Y(Z)/X(Z) = k1 + k2\, Z^{-1}$$

The delay operation is created by controlling the ADC to MDAC data transfer timing.

The circuit includes an ADC 72 and a digital delay device 74 connected to the gain adjustment circuit 18 of MDAC 16. A second ADC 76 is connected to the MDAC 18 for digitizing the output. Finally, in a fourth embodiment, the IC 10 is configured to implement a feedback operation. The time domain transfer function is as follows:

$$y(n) = K1\, A \times (n) - K2\, y(n-1)$$

and the Z-domain transfer function is:

$$(Y(Z))/(\times(Z)) = (K1\, A)/(1 + K2\, Z^{-1})$$

The circuit includes an external analog system 78 and a feedback circuit; the feedback circuit includes an ADC 80 connected to the external analog system 78 and an off chip digital device 82 connected to the ADC. The offset correction circuit 20 of MDAC 16 is connected to the digital delay device 82.

Although several embodiments of this invention have been described, it will be apparent to a person skilled in the art that various modifications to the details of construction shown and described may be made without departing from the scope of this invention.

What is claimed is:

1. An analog signal conditioning and digitizing circuit means comprising an integrated circuit having a channel including a multiplying digital to analog converter, for providing gain adjustment and offset correction to an input voltage and an analog to digital converter operatively connected to the multiplying digital to analog converter for sampling, holding and digitizing the input voltage, said multiplying digital to analog converter comprising a summing and inverting negative feedback amplifier means for gain adjustment and offset noise correction and a correlated double sample circuit means connected to the amplifier means for subtracting or nulling sampled noise of the amplifier.

2. An analog signal conditioning and digitizing circuit means according to claim 1 wherein said integrated circuit includes a plurality of said channels and a tri-state bus operatively shared by the plurality of channels for providing a digital multiplexing capability.

3. An analog signal conditioning and digitizing circuit means according to claim 1 wherein the summing and inverting negative feedback amplifier comprises a gain capacitor array means, an offset capacitor array means, an operational amplifier and a feedback means, the operational amplifier and feedback means operatively connected to the gain capacitor array means and the offset capacitor array means.

4. An analog signal conditioning and digitizing circuit means according to claim 3 wherein the gain capacitor array means and offset capacitor array means each include a plurality of capacitors having binary number code related capacitance values, the gain and offset capacitor arrays each having a plurality of capacitors having first and second plates, the first plates of each array being connected in common, a plurality of switches operatively connected to the second plates of each array of capacitors for switching between a signal input and a reference voltage, control logic means and coefficient register connected to the plurality of switches for selectively switching the switches whereby the gain of the multiplying digital to analog converter is set by the sum of the capacitance values connected to the input voltage divided by the value of the feedback means and the amount of offset is set by the sum of the capacitance value connected to the multiplying digital to analog converter divided by the value of the feedback means.

5. An analog signal conditioning and digitizing circuit means according to claim 4 wherein the feedback means includes a feedback capacitor operatively connected to the operational amplifier whereby the value of the feedback means is the capacitance of the feedback capacitor.

6. An analog signal conditioning and digitizing circuit means according to claim 5 wherein the feedback means further includes a feedback clamp transistor operatively connected to the operational amplifier and feedback capacitor for periodically resetting the multiplying digital to analog converter and correcting drifts that occur from charge leakage off the capacitor arrays and feedback capacitor.

7. An analog signal conditioning and digitizing circit means according to claim 1 wherein the correlated double sample circuit comprises a series capacitor and a series clamp transistor operatively connected to the summing and inverting negative feedback amplifier means for subtracting or nulling the sampled noise across the series capacitor.

8. An analog signal conditioning and digitizing circuit means comprising an integrated circuit having a channel including a multiplying digital to analog converter, for providing gain adjustment and offset correction to an input voltage and an analog to digital converter operatively connected to the multiplying digital to analog converter for sampling, holding and digitizing the input voltage, said analog to digital converter means including a sample and hold and conversion means, a comparator means, an offset correction circuit, a successive approximation register, and a serial shift register, the sample and hold and conversion means for sampling and holding an input voltage during conversion, the comparator means operatively connected to the sample and hold and conversion means and offset correction circuit for comparing the output of the sample and hold and conversion means to the output of the offset correction circuit means, the successive approximation register operatively connected to the serial shift register for receiving and sequencing a bit through the sample and hold and conversion means and to the output of the comparator for performing a testing and/or reset operation and outputting a final state.

9. An analog signal conditioning and digitizing circuit means according to claim 8 wherein the analog to digital converter means includes a capacitor array for sampling and holding a charge in the array during conversion, a plurality of switches operatively connected to the capacitor array for selectively switching an isolated plate of each capacitor between analog ground and a reference voltage for conversion and charging the common plate of the capacitor array for comparison by the comparator with the offset correction circuit after each switch of the switches and selectively resetting or leaving set the switches.

10. An analog signal conditioning and digitizing circuit according to claim 9 wherein the capacitor array is an array of switching transistors.

11. An analog signal conditioning and digitizing circuit means according to claim 8 further including an output register operatively connected to the successive approximation register for holding the result of a previous conversion while allowing the start of a successive conversion prior to transfer of the prior comparison to external logic circuits.

12. An analog signal conditioning and digitizing circuit means according to claim 1 wherein the integrated circuit further includes separate bond pads for the analog signal inputs and outputs of the MDACs and ADCs.

13. An analog signal conditioning and digitizing circuit according to claim 2 wherein the integrated circuit plurality of ADCs and DACs are tied to a common digital bus for providing a feedforward discrete time transfer function.

14. An analog signal conditioning and digitizing circuit according to claim 1 wherein the integrated circuit MDAC and ADC are operatively connected to provide a feedback time domain transfer function.

* * * * *